March 1, 1960 R. M. SHULTZ 2,927,242

TRANSISTOR DRIVEN PULSE CIRCUIT

Filed June 8, 1956

INVENTOR.
ROBERT M. SHULTZ
BY
Charles F. Carroll, Jr.
ATTORNEY 2,927,242
Patented Mar. 1, 1960

2,927,242

TRANSISTOR DRIVEN PULSE CIRCUIT

Robert M. Shultz, Malvern, Pa., assignor to Burroughs Corporation, Detroit, Mich., a corporation of Michigan Application June 8, 1956, Serial No. 590,272
7 Claims. (Cl. 315—8.5)

This invention relates to transistor-driven pulse circuits and more specifically to a highly reliable transistorized counter using a magnetron beam switching tube.

Magnetron beam switching tubes are uniquely useful for reliable, high-speed pulse handling circuits. As shown on page 122 et seq. of "Electronics" for April 1956, vol. 29, No. 4, such tubes are versatile and useful in counters, multiplexers, gates and other pulse circuits. However, each of these applications requires comparatively large supplementary circuits or equipment which consume much power and dissipate much heat, thus limiting the scope of applications. In critical applications, where allowances for size, weight, power and head dissipation are restricted more than ordinarily, transistorized circuits are very useful. If transistorized bistable circuits, and control circuits can be made to function with reliability comparable to that of magnetron beam switching tubes, many advantages are derived from the combination of beam switching tubes operable at low, transistor level voltages with transistors in associated circuits.

An important object of this invention is to provide a novel pulse handling circuit, particularly useful in low-voltage, low-power applications.

Another important object of this invention is to provide a novel combination of a magnetron beam switching tube with transistor reset and switching circuits.

Still another important object of this invention is to provide a highly reliable, non-saturating, bistable transistor driver for a low voltage magnetron beam switching tube.

Generally, and in a preferred embodiment of this invention, there is provided a multi-position magnetron beam switching tube, a zero-set transistor connected to said tube to reestablish an electron beam in an initial position thereof, a nonsaturating bistable switching circuit including twin transistor means each having a negative resistance emitter characteristic, and connected to said tube to switch the beam thereof, and a transistor input driver connected to the emitters of said bistable switching circuit, and responsive to input pulses to trigger said bistable circuit despite the negative resistance thereof.

For a more detailed description of this invention, reference is made to the drawings, in which.

Figure 1:
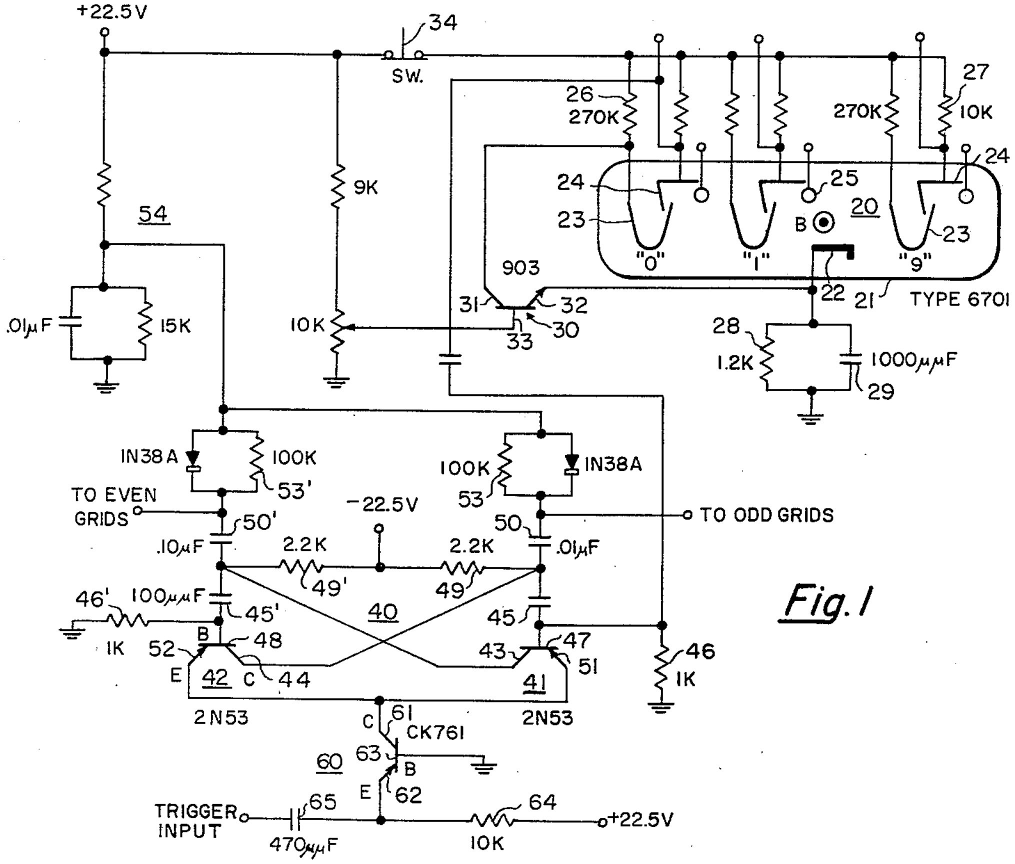
Fig. 1 is a schematic circuit of a transistor driven pulse handling circuit.

In Fig. 1, magnetron beam switching tube 20 is a multi-position electron beam tube of the type disclosed in U.S. Patent No. 2,721,955, issued October 25, 1955, to Sin-pih Fan et al., entitled "Multi-Position Beam Tube," and assigned to the assignee of the present application. By use of the crossed electric and magnetic fields of a magnetron type structure and of a number of electrodes in successive arrays around a cathode, this tube can provide a high current electron beam to a plurality of output electrodes in rapid succession and with great reliability.

A cylindrical magnet 21 encloses tube 20 and provides an axial magnetic field therethrough. Tube 20 contains a central axial cathode 22 surrounded by several concentric arrays of electrodes. On a circular locus nearest to the cathode are the beam forming and holding electrodes 23, called spade electrodes. Beyond the spade electrodes on another circular locus are the target electrodes 24, positioned peripherally on this circle so as to cover the inter-spade spaces and to collect beam current flowing into such spaces between spades. Intermediate between one edge of each spade and the near edge of each target proximate to that spade are the switching grid electrodes 25. These grids also are on a circular locus centered on the cathode 22.

With the cathode heated to electron emission temperature and a positive potential on the spade electrodes and target electrodes, the magnetic field from magnet 21 is above that value required for magnetron type cut-off of current in the tube and no current will flow. However, if one of the spade electrodes is reduced in potential to about half its previous potential the voltage gradients within the tube are distorted and a beam will form. This electron beam grazes the low potential spade and strikes the adjacent target electrode. A small portion of the electron beam does flow to this spade. With a suitable series resistor interposed in the connection of each spade to its positive voltage supply, this small portion of the beam current produces an IR drop which enables the spade to hold the beam stably in place once it grazes that spade.

Switching grid electrodes 25 upset this stable beam holding condition when a suitable negative potential is applied to the grid which is in the same interspade space as is the beam. As this grid goes negative, the beam fans out across the target electrode and some of it strikes the next spade electrode. This fraction of beam current produces another IR voltage drop which lowers the potential of this next spade. With a lowered potential on the next spade, the beam switches over to the next target. This switching action occurs at a very rapid rate, the time required to switch from one target to the next being in the order of one-tenth of a microsecond.

For clarity in the drawing, only a few of the beam positions of tube 20 are shown, and these are displayed in a linear configuration. The actual tube can be either linear or coaxial.

The electrode configuration and magnetic field B of tube 20 are proportioned to be operable on voltages usually provided for transistor circuits. Also, various connecting resistors must have ohmic values useful for operation on such voltages. Each spade 23 has a series resistor 26, each target 24 has a series resistor 27, and cathode 22 has series resistor 28; all connecting to appropriate levels in a voltage supply. Capacitor 29 is used to bypass pulse and noise voltages and current.

Transistor 30 has its collector 31 connected to one of the spades 23, designated the initial or "zero" spade. Its emitter 32 connects to cathode 22 and its base 33 connects to an adjustable voltage divider which in turn is connected from a positive voltage to ground on the voltage supply. When a beam is formed in tube 20, beam current through cathode resistor 28 develops a positive bias on both cathode 22 and emitter 32. The adjustable voltage divider is set so that the above bias cuts off transistor 30. Tube 20 may be deenergized by opening switch 34 to disconnect the power supply from the spade, or beam controlling, electrodes 23 and the target electrodes 24. When switch 34 is closed so that the power supply is again applied, no current will flow from the cathode to any one of the target electrodes because the strength of the magnetic field and the amplitude of the applied voltage is such that substantially all the electrons emitted from cathode 22 are returned to it. However, when no current is flowing through the cathode bias resistor 28, the amplitude of the voltage applied to the base 33 of reset transistor 30 is sufficient to cause reset transistor 30 to conduct. This causes the potential of beam electrode 23 to become less positive so that an electron beam is formed which strikes the target electrode 24 at the "0" or reset position of the magnetron beam switching tube. As soon as current flows through tube 20, the potential of its cathode 22 becomes sufficiently positive to cut off reset transistor 30. With beam and bias resumed, transistor 30 once more cuts off. Switch 34 can be used to clear an existing beam, to initiate this reset action as described.

Switching electrodes 25 can be connected into sets of alternate electrodes, i.e. all "odd" (1, 3, 5, etc.) electrodes in one set and all "even" (0, 2, 4, etc.) electrodes in another set, to provide reliable single-step beam switching. To provide the push-pull signals which these sets of switching electrodes require, a non-saturating twin transistor bistable circuit 40 is provided. Point contact, type 2N53 transistors 41 and 42 are used in this preferred embodiment, but any transistor device providing current multiplication, or a "hook characteristic" as does a point-contact transistor, in an emitter controlled circuit, can be used. Such characteristics are described on pages 75–79, 357–358, 442, and 488 of "Transistor Electronics" by Lo, Endres, Zawels, Waldhauer and Cheng, and published by Prentice-Hall, Inc.

Figures 2, 3:
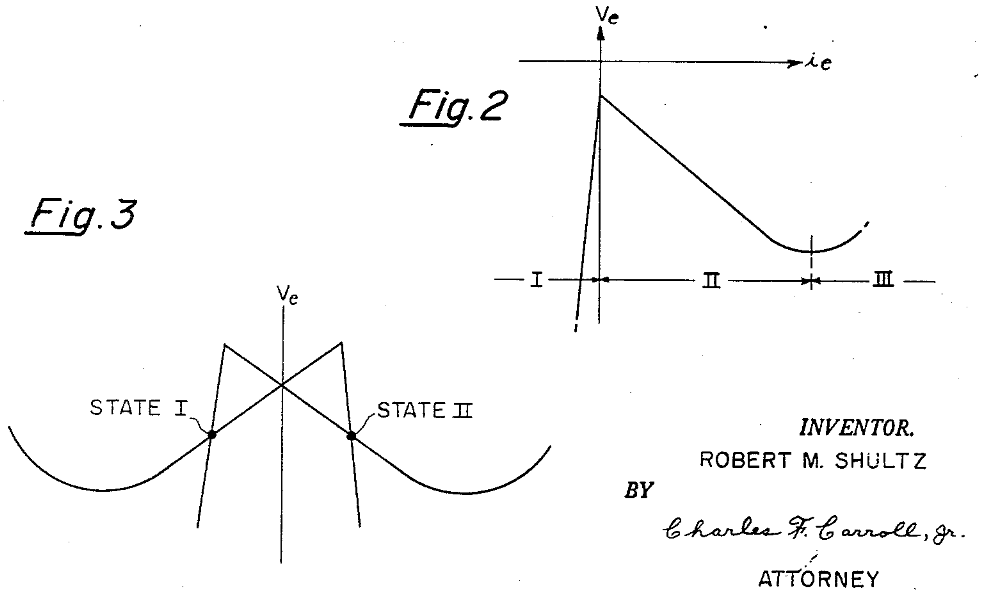
Fig. 2 is a graph of emitter current vs. emitter voltage for a point contact transistor under an emitter control.
Fig. 3 is a graph of emitter current vs. emitter voltage for a plurality of point contact transistors having a common emitter circuit.

Briefly, this characteristic is as shown in Fig. 2, graphically presenting the relation between emitter voltage $V_e$ and emitter current $i_e$ for a point-contact type transistor. In region I, to the left of the $V_e$ axis, the emitter voltage is in the reverse direction and the transistor is in the cut-off state. In region II the emitter voltage is in the forward direction and the collector remains reverse-biased, putting the transistor in the active state and providing current gain. In this region the emitter has a negative resistance arising from a positive feedback. This positive feedback is provided by the emitter-collector current gain and the resistance of the base circuit. If this positive feedback is enough to overcome circuit losses, currents in the transistor increase until saturation is reached. This marks the end of region II. In region III both the emitter and collector are conducting, but in the saturation state. Here, the emitter characteristic is positive, being the low forward resistance, without the positive feedback of the active state of region II. Operating points will be determined by the intersection of resistor load lines with this characteristic. When two transistors are connected with a common emitter circuit, each emitter serves as the other's load resistor, giving two stable states as shown in Fig. 3.

As shown in Fig. 1, transistors 41 and 42 are in a twin-transistor, non-saturating, bistable circuit. Collectors 44 and 43 cross-connect through differentiating capacitors 45 and 45' to the other transistor's base electrode 47 and 48 respectively. Collector connections also continue through resistors 49 and 49' to the negative supply voltage. Base electrodes 47 and 48 are grounded through resistors 46 and 46'. Collectors 43 and 44 are further coupled through capacitors 50 and 50' to the common sets of odd and even switching electrodes 25. Direct current bias for these switching electrodes is provided through resistors 53 and 53' from a resistive voltage divider 54 connected to the positive voltage supply. When either transistor is switched to off state a negative going pulse is applied to the switching electrodes connected to the collector of that transistor and to the base of the other transistor. In this respect, a negative going-pulse applied to a base electrode will trigger that transistor to the "on" state and the other transistor to the "off" state. A capacitive coupling from the target of the "zero" position of tube 20 to the base electrode 47 of transistor 41 insures that flip-flop 40 is in the proper state for a switching cycle to proceed. Emitters 51 and 52 are directly connected to the emitter 61 of transistor 60 so that transistor 60 is common to the emitter circuits of both transistors 41 and 42 of the bistable circuit 40. This provides two stable operation points for the circuit. In much of the region between these stable operating points, however, both emitter characteristics show negative resistance. Response of such a complex load characteristic to incoming pulses is unpredictable and very unreliable when operated with previously known drivers.

There are minimum requirements for current pulses which will switch a bistable circuit, as expressed in Figs. 12–51 and 52 of above cited "Transistor Electronics"; and such requirements are difficult to meet when the load resistance varies widely, even into the negative-resistance region. A constant current device is highly preferred as a driver for such circuits, since it tends to provide the desired magnitude of current regardless of load resistance variations.

A circuit including transistor 60 was developed as a driver for such negative resistance loads. Collector 61 connects to emitters 51 and 52, base 63 is grounded, and emitter 62 is connected through resistor 64 to a positive voltage supply. Coupling capacitor 65 connects to emitter 62, to provide an input circuit for triggering pulses.

When a negative going trigger pulse is applied to the emitter 62 of transistor 60, a negative going pulse appears on collector 61 and is applied to emitters 51 and 52. The "equivalent generator" resistance of collector 61 is very high, making it a practical constant-current source of pulses. Because of this high-resistance/constant current characteristic, emitters 51 and 52 will be driven by an adequate pulse despite their variable load characteristic, i.e. a triggering level pulse current will flow, regardless of such variations in the load resistance into which it flows. In this manner, the bistable circuit 40 is made reliably responsive to trigger pulses applied on input coupling capacitor 65.

When emitters 51 and 52 receive a negative going pulse, emitter current stops and both transistors 41 and 42 turn off momentarily. Assuming transistor 41 was "on" when the trigger pulse was received, the voltage of collector 43 now suddenly changes to a more negative value, sending a negative pulse through differentiating capacitor 45' to the base 48 of "off" transistor 42, turning it "on." The next pulse upon emitters 51 and 52 reverses the above described sequence, turning transistor 41 "on."

In this circuit, lock-in is provided through use of a common load impedance for the emitters. Emitter current of the "on" unit develops a voltage drop which biases the "off" unit to hold it in that state. The coupling capacitors 45 and 45' are required, to enable the circuit to function as a bistable circuit rather than as a one-bit register, which it would be if capacitors 45 and 45' were not used. Such a one-bit register is shown in Figs. 12–38 of above cited "Transistor Electronics." Because of capacitors 45 and 45' the more negative voltage on the collector of the "off" transistor cannot be applied to the base of the "on" transistor to assist in maintaining the circuit stably in one of the bistable states, to assure reliable operation. Stability is dependent solely upon common emitter circuit resistance, and when used with heretofore known drivers provides poor stability due to the negative resistance characteristics of the emitters. As stated on page 470 of above cited "Transistor Electronics," ". . . Simplicity is achieved in this circuit at the expense of the maximum repetition frequency and reliability." Experience has shown these deficiencies to be so serious as to preclude use of this circuit in practical equipment, for even moderate reliability. This invention provides a combination of this highly desirable, simplified bistable circuit 40 with an input driver 60 which assures reliable operation and lock-in, with no decrease in maximum switching frequency.

What is claimed is:

1. A pulse counter comprising in combination: a magnetron beam switching tube including a plurality of output electrodes, a plurality of beam controlling electrodes, a cathode, and a plurality of switching electrodes, the odd numbered switching electrodes and the even numbered switching electrodes being electrically interconnected; a bias resistor connected in series with the cathode; circuit means including a switch for connecting a source of potential to the electrodes of the tube, said switch being operable to disconnect the source of potential from the tube; a reset transistor having a collector, an emitter and a base, the emitter being connected directly to the cathode of the beam switching tube and the collector being connected to one of the beam controlling electrodes; circuit means for applying a direct-current bias voltage to the base of the reset transistor, the amplitude of the bias voltage being such that the reset transistor is conducting when substantially no current is flowing through the base resistor and said reset transistor is biased off when current flows through the base resistor; a bistable circuit including a pair of transistors, each of which has a negative resistance emitter characteristic; circuit means cross-coupling the collectors and bases of said pair of transistors; circuit means coupling the collector of one of said pair of transistors to the even numbered switching electrodes; circuit means coupling the collector of the other of said pair of transistors to the odd numbered switching electrodes; a driver transistor having a base, an emitter and a collector; circuit means connecting the emitters of said pair of transistors to the collector of said driven transistor; circuit means adapted to apply a second direct-current voltage to the emitter of said driver transistor; and circuit means for connecting the base of said driver transistor to a point at reference potential; the magnitude of the second direct-current voltage being such that the driver transistor is normally conducting; and means for applying trigger pulses to the emitter of the driver transistor, the amplitude and polarity of the trigger pulses being such as to normally cut off the driver transistor.

2. In a pulse circuit; the combination comprising a magnetron beam switching tube including at least a plurality of beam controlling electrodes and a cathode; a cathode bias resistor connected between the cathode of said tube and a point at reference potential; circuit means for applying operating potential to the beam controlling electrodes; a transistor including a collector connected to one of said beam controlling electrodes, an emitter connected to the cathode of said beam switching tube, and a base connected to a source of bias potential; the amplitude and polarity of the bias potential being such that the transistor is biased on when no current is flowing through the cathode bias resistor and said transistor is biased off when bias current flows through the cathode bias resistor, and circuit means for disconnecting the operating potential from the beam controlling electrodes whereby when the operating potential is disconnected from and then connected to the beam controlling electrodes, an electron beam will be formed which will strike the particular beam controlling electrode connected to the collector of said transistor.

3. In a pulse handling circuit the combination comprising: a magnetron beam switching tube having a cathode and a plurality of beam switching electrodes; circuit means interconnecting the odd numbered switching electrodes; circuit means interconnecting the even numbered switching electrodes; a bistable circuit having two stable states and comprised of a pair of transistors having negative impedance emitter characteristics, each of said transistors having a base, a collector and an emitter; circuit means providing alternating-current cross-coupling between the collectors and bases of said transistors; a driver transistor having a collector, an emitter and a base; circuit means directly connecting the emitters of said pair of transistors of the bistable circuit to the collector of the driver transistor; circuit means adapted to supply operating voltages to the emitter of the driver transistor, to the collectors of the transistors of the bistable circuit, and to the beam switching electrodes and cathode of the magnetron beam switching tube; circuit means adapted to connect the base of said driver transistor to a point at reference potential; circuit means for connecting the collector of one of the transistors of the bistable circuit to the even numbered switching electrodes; circuit means for connecting the collector of the other transistor of the bistable circuit to the odd numbered switching electrodes; the amplitude of the operating voltage adapted to be applied to the emitter of the driver transistor being such as to normally bias on the driver transistor; and circuit means for applying trigger pulses to the emitter of said driver transistor, the amplitude of the trigger pulses being such to normally cut off the driver transistor to cause the bistable device to change state.

4. A pulse handling circuit comprising a magnetron beam switching tube including a plurality of output electrodes, a plurality of beam controlling electrodes, a plurality of beam switching electrodes in common circuits of alternate switching electrodes, and a cathode; a bias resistor connected in series with the cathode; a non-saturating flip-flop circuit including twin transistors having separate output elements coupled to said common circuits of switching electrodes and commonly connected input elements, said twin transistors having negative resistance emitter characteristics; a driver transistor including a collector connected to said commonly connected input elements and an emitter input circuit; a reset transistor including a collector connected to one of said beam controlling electrodes and an emitter connected to said cathode; a resistor network for interconnecting said transistors and beam switching tube with a source of voltage to provide operating voltages; and switch means for disconnecting the source of voltages from, and connecting the source of voltages to, the beam controlling and output electrodes.

5. In a pulse handling circuit, a bistable flip flop comprising a pair of semi-conductor amplifying devices, each of said devices having an emitter, a collector and a base, each of said devices having negative resistance emitter characteristics, solely alternating-current circuit means cross-connecting the collectors and bases of said devices; means adapted to apply operating potentials to the collectors of said devices, resistive circuit means adapted to connect the bases of the devices to a point at reference potential, a driver transistor having a collector, a base and an emitter; circuit means directly connecting the collector of the driver transistor to the emitters of said devices, means adapted to directly connect the base of said driver transistor to a point at reference potential, circuit means adapted to apply a fixed direct-current operating potential to the emitter of the driver transistor so that said driver transistor acts as a substantially constant current device for supplying a fixed selected amount of emitter current to that one of the semi-conductor devices which is conducting, circuit means adapted to apply trigger pulses to the driver transistor for causing the driver transistor to become non-conducting thereby to cause that one of the semi-conductor devices which was conducting to become substantially non-conducting and thereby to pass a voltage pulse through said alternating-current circuit means which cross-connects the collectors and bases of said devices, said voltage pulse thus applied to the base of said other device causing the other device to become conducting.

6. In a pulse handling circuit, a bistable flip flop comprising a pair of semi-conductor amplifying devices, each of said devices having an emitter, a collector and a base, the emitter characteristics of said devices being divided into three regions, a cut off region, a negative resistance region and a saturated region; solely alternating current circuit means cross-connecting the collector and bases of said devices; resisitive circuit means adapted to connect the bases of the devices to a point at reference potential; circuit means adapted to apply direct-current operating potentials to the collectors of said devices; a driver junction transistor having a base, an emitter and a collector direct-current circuit means directly connecting the collector of the driver transistor to the emitters of both said devices; direct-current circuit means adapted to connect the base of said driver transistor to a point at reference potential; direct-current circuit means adapted to apply a substantially fixed direct-current operating voltage to the emitter of the driver transistor, the amplitude and the polarity of the voltage applied to the emitter being such as to normally cause the driver transistor to be conducting, the circuit parameters and the characteristics of the driver transistor being such that it functions as a constant current source, the amount of current passing through the driver transistor, when it is conducting, being of a value such as to provide the amount of emitter current which causes one of the devices of said pair of amplifier devices to be operating in the negative resistance region of its characteristic while the other device is operating in the cut off region; alternating-current circuit means for applying trigger pulses to the emitter of the driver transistor for momentarily cutting off the driver transistor, thereby to cut off that one of said devices which was conducting and thereby to pass a voltage pulse through said alternating-current circuit means cross-connecting the collector and bases of said devices, thereby to turn on the other of said devices, thereby to cause the device which was operating in its cut off region, prior to the application of a given trigger pulse, to operate in the negative resistance region of its characteristic after the application of said trigger pulse, and the device which was operating in the negative resistance region of its emitter characteristic prior to the application of said trigger pulse, to be operating in its cut off region after the application of said trigger pulse.

7. A pulse counter comprising in combination a magnetron beam switching tube including a plurality of output electrodes, a plurality of beam controlling electrodes, a plurality of switching electrodes in common connections of alternate switching electrodes and a cathode; a bias resistor connected in series with the cathode; a reset transistor including a collector connected to one of said beam controlling electrodes, an emitter connected to said cathode, and a base; a non-saturating bistable circuit including twin transistor devices with hook characteristics having bases respectively coupled to said common connections of alternate switching electrodes, collectors cross coupled to the other transistor base, and emitters in a common connection to receive trigger pulses; a driver transistor having a collector connected to said common emitter connection, an emitter adapted adapted to receive input trigger pulses, and a base; a resistive network connected to said transistors and to said beam switching tube and adapted for connection to supply voltages; switch means for connecting the supply voltage to, and disconnecting the supply voltage from, the beam controlling electrodes.

References Cited in the file of this patent

UNITED STATES PATENTS

| | | |
|---|---|---|
| 2,531,076 | Moore | Nov. 21, 1950 |
| 2,562,530 | Dickinson | July 31, 1951 |
| 2,569,345 | Shea | Sept. 25, 1951 |
| 2,594,336 | Mohr | Apr. 29, 1952 |
| 2,721,955 | Fan et al. | Oct. 25, 1955 |
| 2,739,190 | Wallace | Mar. 20, 1956 |
| 2,764,711 | Kuchinsky | Sept. 25, 1956 |
| 2,774,888 | Trousdale | Dec. 18, 1956 |
| 2,794,147 | Bethke | May 28, 1957 |
| 2,846,594 | Pankratz et al. | Aug. 5, 1958 |

FOREIGN PATENTS

| | | |
|---|---|---|
| 165,669 | Australia | June 3, 1954 |

OTHER REFERENCES

John Bethke: "New Applications for Beam Switching Tubes," Electronics, April 1956, vol. 29, No. 4, pages 122 et seq.